United States Patent [19]

Suzuki et al.

[11] Patent Number: 5,607,880
[45] Date of Patent: Mar. 4, 1997

[54] METHOD OF FABRICATING MULTILEVEL INTERCONNECTIONS IN A SEMICONDUCTOR INTEGRATED CIRCUIT

[75] Inventors: Mieko Suzuki; Tetsuya Homma, both of Tokyo, Japan

[73] Assignee: NEC Corporation, Tokyo, Japan

[21] Appl. No.: 53,369

[22] Filed: Apr. 28, 1993

[30] Foreign Application Priority Data

Apr. 28, 1992 [JP] Japan ................................ 4-109383

[51] Int. Cl.$^6$ ............................ H01L 21/44; H01L 21/48
[52] U.S. Cl. ......................... 437/195; 437/228; 437/231
[58] Field of Search .................................. 437/194, 195, 437/231, 228 ST, 228 P, 238

[56] References Cited

U.S. PATENT DOCUMENTS

| | | | |
|---|---|---|---|
| 4,670,967 | 6/1987 | Hazuki | 29/576 B |
| 4,744,861 | 5/1988 | Matsunaga et al. | 156/643 |
| 4,800,179 | 1/1989 | Mukai | 437/203 |
| 4,920,072 | 4/1990 | Keller et al. | 437/192 |
| 5,212,114 | 5/1993 | Grewal et al. | 437/192 |
| 5,244,841 | 9/1993 | Marks et al. | 437/228 |
| 5,250,468 | 10/1993 | Matsuura | 437/194 |
| 5,266,525 | 11/1993 | Morozumi | 437/195 |
| 5,288,664 | 2/1994 | Mukai | 437/173 |
| 5,312,775 | 5/1994 | Fujii et al. | 437/192 |
| 5,319,247 | 6/1994 | Matsuura | 257/760 |
| 5,332,694 | 7/1994 | Suzuki | 437/195 |
| 5,344,797 | 9/1994 | Pai et al. | 437/238 |

FOREIGN PATENT DOCUMENTS 4296030A   10/1992   Japan ..................................... 437/194

OTHER PUBLICATIONS

Wolf, "Silicon Processing for the VLSI Era, vol. I", pp. 569–574, 1986, Lattice Press, month unknown.
"Low–Temperature APCVD Oxide TEOS–Ozone Chemistry for Multilevel Interconnections", *IEEE*, 1989, By H. Kotani et al., pp. 28.2.1–28.2.4, month unknown.
"Reaction Mechanism of TEOS and $O_3$ Atmospheric Pressure CVD", *IEEE*, Jun. 11–12, 1991, By K. Fujino et al., pp. 445–447.
"Surface Modification of Base Materials for TEOS/$O_3$ Atmospheric Pressure Chemical Vapor Deposition", *J. Electrochem. Soc.*, vol. 139, No. 6, Jun. 1992, By K. Fujino et al., pp. 1690–1692.

*Primary Examiner*—John Niebling
*Assistant Examiner*—Richard A. Booth
*Attorney, Agent, or Firm*—Young & Thompson

[57] ABSTRACT

The invention provides a fabrication method of multilevel interconnections for semiconductor integrated circuits. Aluminium wiring lines are formed on a first silicon oxide film overlying a silicon substrate. A second silicon oxide film is grown by a plasma chemical vapor deposition on the wiring lines and the first silicon oxide film for a specific surface treatment of either an etching with use of fluorine compounds or an ion-implantation of fluorine compounds. A third silicon oxide film is grown on the second silicon oxide film by an atmospheric pressure chemical vapor deposition with use of organic silicon compounds and an oxygen including ozone.

37 Claims, 4 Drawing Sheets

METHOD OF FABRICATING MULTILEVEL INTERCONNECTIONS IN A SEMICONDUCTOR INTEGRATED CIRCUIT

BACKGROUND OF THE INVENTION

1. Field of the Invention

The invention relates to a method of fabricating a semiconductor device, and more particularly to a method of fabricating a multilevel interconnections in a semiconductor integrated circuit device.

2. Description of the Related Art

The importance of a fabrication technology of multilevel interconnections for a semiconductor integrated circuit device, particularly VLSI device is on the increase because the quality of the multilevel interconnections defines a degree of integration or a packing density, device performance, yield and reliability. Possible improvements in the high integration, the device performance, the yield and the reliability depends upon the fabrication method of the multilevel interconnections in the semiconductor integrated circuit.

A typical and conventional fabrication method of multilevel interconnections in a semiconductor integrated circuit device is disclosed in 1989, IEEE International Electron Devices Meeting Technical Digest pp. 669–672. The fabrication method of multilevel interconnections will be described with reference to FIGS. 1A and 1B.

Figure 1A:
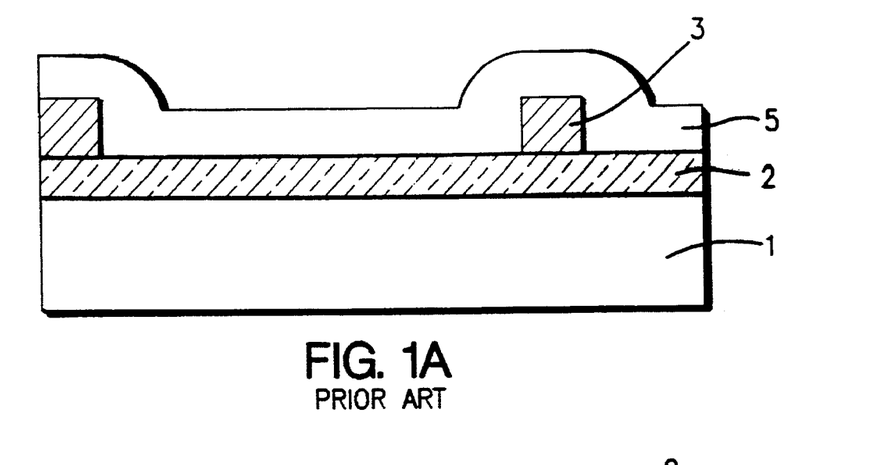
FIGS. 1A and 1B are fragmentary cross sectional elevation views illustrative of sequential steps involved in the conventional fabrication method of multilevel interconnections in a semiconductor integrated circuit device.

With reference to FIG. 1A, a semiconductor substrate 1 which has been formed with diffusion layers is prepared. A first silicon oxide film 2 is formed on the semiconductor substrate 1. A layer made of aluminum is deposited on the first silicon oxide film 2 for a subsequent receipt of patterning to form aluminum wiring lines 3 on the first silicon oxide film. An atmospheric pressure chemical vapor deposition which uses tetraethoxysilane (TEOS) and an oxygen including ozone as source gases is accomplished thereby a second silicon oxide film 5 is deposited on the second silicon oxide film 2 so as to cover the aluminum wiring lines 3.

Figure 1B:
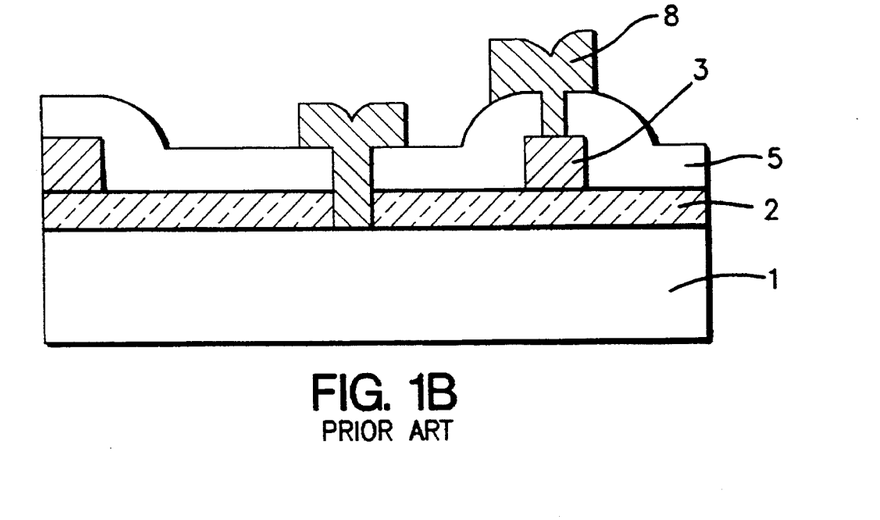

With reference to FIG. 1B, after an alignment of a photo-resist which has been patterned, the first and second oxide films 2 and 5 are subjected to a selective etching which uses the photo-resist pattern. As a result, a through hole is formed both in the first and second oxide films 2 and 5 so that a part of a surface of the semiconductor substrate 1 is exposed through its through hole. Another through hole is concurrently formed in the second silicon oxide film only but directly over the aluminum wiring line 3 so that a part of the aluminum wiring line 3 is exposed through its through hole. A layer made of aluminum is deposited on an entire surface of the device so that the through holes are filled with the aluminum layer. The deposited aluminum layer receives such a patterning as to make the aluminum layer remain only within and in the vicinity of through holes. This results in a formation of aluminum wiring lines comprising the remaining aluminum layers which are in contact with the surface of the semiconductor substrate 1 and the aluminum wiring lines 3 underlying the second silicon oxide film 5 respectively.

Actually, the above processes will be repeated several times for the formation of the multilevel interconnections, although illustrations thereof are omitted. The second silicon oxide film 5, thus, serves as an interlayer insulator.

Figure 2A:
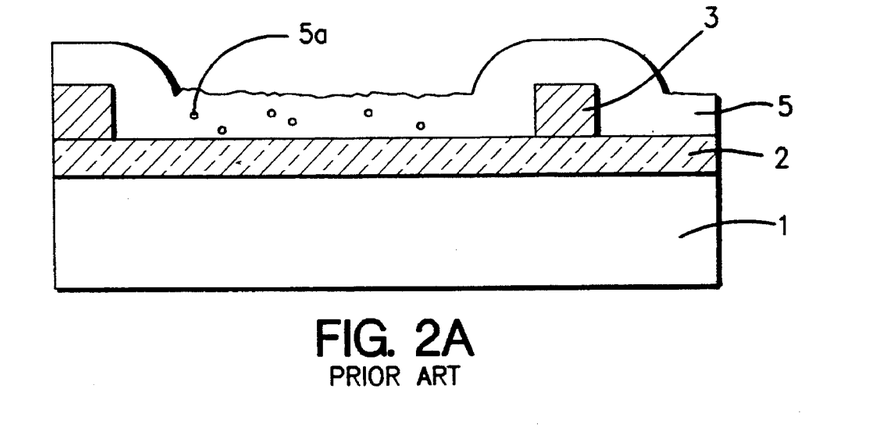
FIGS. 2A and 2B are fragmentary cross sectional elevational views illustrative of the problems in sequential steps involved in the conventional fabrication method of multilevel interconnections in a semiconductor integrated circuit device.
Figure 2B:
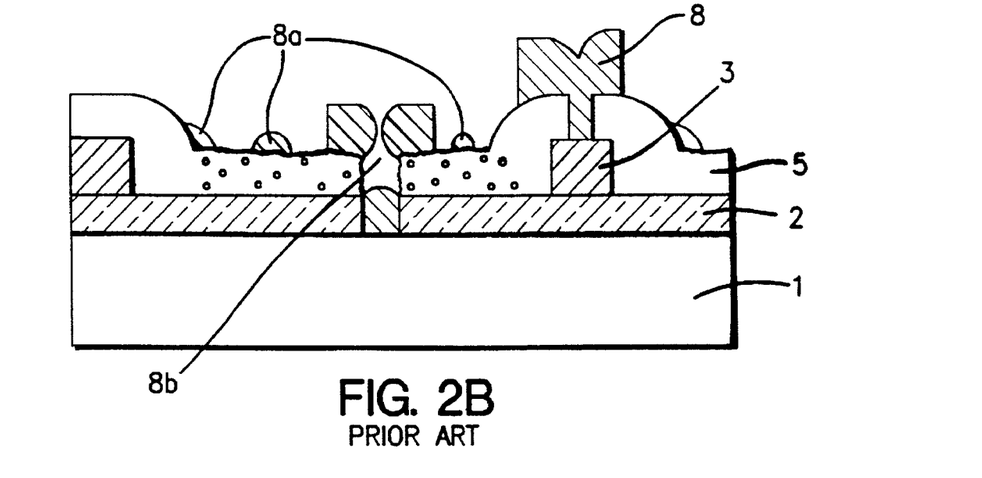

The quality of the multilevel interconnections in the semiconductor integrated circuit device will be investigated with reference to FIGS. 2A and 2B.

As described above, the second silicon oxide film 5 was formed by the atmospheric pressure silicon chemical vapor deposition which uses tetraethoxysilane and the oxygen including ozone as source gases. As illustrated in FIG. 2A, the second silicon oxide film 5 serving as the interlayer insulator has an excellent flatness but only at a part over the aluminum wiring lines 3. The second silicon oxide film except for the part over the aluminum wiring lines 3 has a surface having a poor leveling quality. Namely, an extremely inferior leveling grade appears at the surface of the second silicon oxide film except for the part over the aluminum wiring lines 3. The second silicon oxide film except for the part over the aluminum wiring lines 3 includes many bubbles or voids 5a. Such appearances of both the bubbles or voids 5a in the second oxide film 5 and the extremely inferior leveling quality of that surface are increasingly considerable when the flow rate of ozone and the thickness of the second oxide film are on the increase.

Such undesirable phenomenon of the extremely inferior leveling quality and the many bubbles or voids 5a also appears when the second silicon oxide film 5 is deposited by the atmospheric pressure chemical vapor deposition after a silicon oxide film is deposited by a plasma chemical vapor deposition.

When the through hole is formed in the second silicon oxide film 5 including the bubbles or voids 5a, the through hole also has a side wall having a poor leveling quality which is deemed to be caused by the bubbles or voids 5a. It appears that such side wall having a poor leveling quality of the through hole causes a disconnection 8b of the aluminum wiring line 8 within the through hole. Further, it appears that after the etching process for the aluminum layer, the aluminum layer remains not only within and in the vicinity of the through holes but also on the surface of the second silicon oxide film 5. The remaining aluminum layer on the surface of the second silicon oxide film 5 causes a short of the aluminum wiring lines 8.

Consequently, the use of the atmospheric pressure chemical vapor deposition for formation of the second silicon oxide film results in an inferior leveling of the surface of the second silicon oxide film 5 and the existence of the many bubbles or voids in the second silicon oxide film 5. These cause the disconnection and the short of the aluminum wiring lines 8 thereby resulting in a considerable inferiority of the device performance, yield and reliability of the semiconductor integrated circuit including such silicon oxide film 5 being formed by the conventional atmospheric pressure chemical vapor deposition method.

In replacement of such conventional fabrication process, it is therefore required to develop a novel fabrication method of the multilevel interconnections, which makes the interlayer insulator free from both the inferior leveling of the surface of the interlayer insulator and the appearances of the bubbles or voids in the interlayer insulator.

SUMMARY OF THE INVENTION

Accordingly, it is a primary object of the present invention to provide a novel fabrication method of multilevel interconnections in semiconductor integrated circuit devices.

It is a further object of the present invention to provide a novel fabrication method of multilevel interconnections in semiconductor integrated circuit devices, which allows insulation films to be free from inferior leveling of its surface.

It is a still further object of the present invention to provide a novel fabrication method of multilevel interconnections in semiconductor integrated circuit devices which allows insulation films to be free from the appearance of bubbles or voids.

It is yet a further object of the present invention to provide a novel fabrication method of multilevel interconnections in semiconductor integrated circuit devices which allows metal wiring lines or layers to be free from disconnection and short.

It is a further more object of the present invention to provide a novel fabrication method of multilevel interconnections in semiconductor integrated circuit devices which allows the integrated circuit device to be free from inferior yield.

It is an additional object of the present invention to provide a novel fabrication method of multilevel interconnections in semiconductor integrated circuit devices which allows the integrated circuit device to be free from inferior performance.

It is another object of the present invention to provide a novel fabrication method of multilevel interconnections in semiconductor integrated circuit devices which allows the integrated circuit device to be free from inferior reliability.

The above and other objects, features and advantages of the present invention will be apparent from the following descriptions.

The present invention provides a novel method of fabricating a multilevel interconnection for a semiconductor device. A first silicon oxide film is grown on a silicon substrate by a chemical vapor deposition. First metal wiring lines are formed on the first silicon oxide film. A second silicon oxide film is grown by a plasma chemical vapor deposition on both the metal wiring lines and the first silicon oxide film. The deposited second silicon oxide film is subjected to either a dry etching with a fluorine compound such as $CHF_3/O_2$, $CF_4$, $CF_6$ and $CCl_2F_2$ or an ion-implantation of a fluorine compound such as $AsF_3$, $AsF_5$ and $BF_3$. A third silicon oxide film is grown on the second silicon oxide film by an atmospheric pressure chemical vapor deposition with an organic silicon compound such as ozone and tetraethoxysilane (TEOS). Through holes are formed in the second and third silicon oxide films directly over the first metal wiring lines. Second metal wiring lines are formed on the third silicon oxide film directly over the first metal wiring lines so that the first and second metal wiring lines are connected through the through hole.

The present invention also provides another novel method of fabricating a multilevel interconnection for a semiconductor device. A first silicon oxide film is grown on a silicon substrate by a chemical vapor deposition. First metal wiring lines are formed on the first silicon oxide film. A second silicon oxide film is grown by a plasma chemical vapor deposition on both the metal wiring lines and the first silicon oxide film. The deposited second silicon oxide film is subjected to either a dry etching with a fluorine compound such as $CHF_3/O_2$, $CF_4$, $CF_6$ and $CCl_2F_2$ or an ion-implantation of a fluorine compound such as $AsF_3$, $AsF_5$ and $BF_3$. A third silicon oxide film is grown on the second silicon oxide film by an atmospheric pressure chemical vapor deposition with an organic silicon compound such as ozone and tetraethoxysilane (TEOS). A spin-on-glass film is formed on the third silicon oxide film by both a spin coating and a subsequent heat treatment. The spin-on-glass film and the third silicon oxide film are sequentially subjected to an etch back treatment by a dry etching. A fourth silicon oxide film is grown on the third silicon oxide film by a plasma chemical vapor deposition. Through holes are formed in the second, third and fourth silicon oxide films directly over the first metal wiring lines. Second metal wiring lines are formed on the third silicon oxide film directly over the first metal wiring lines so that the first and second metal wiring lines are connected through the through holes.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention provides a novel fabrication method of multilevel interconnections in a semiconductor integrated circuit device. A semiconductor substrate, a surface of which is covered with a first silicon oxide film underlying metal wiring lines, are prepared. A second silicon oxide film is deposited on a surface of such semiconductor substrate by a plasma chemical vapor deposition method. A surface of the deposited second silicon oxide film is subjected to either a gas plasma treatment which employs fluorine compounds or an ion-implantation of fluorine compounds for a subsequent atmospheric pressure chemical vapor deposition which uses organic compounds and an oxygen including ozone to form a third silicon oxide film to serve as an interlayer insulator. Such third silicon oxide film not only is free from appearance of bubbles or voids but also has an excellent leveled surface.

A first embodiment according to the present invention will be described with reference to FIGS. 3A to 3D.

Figure 3A:
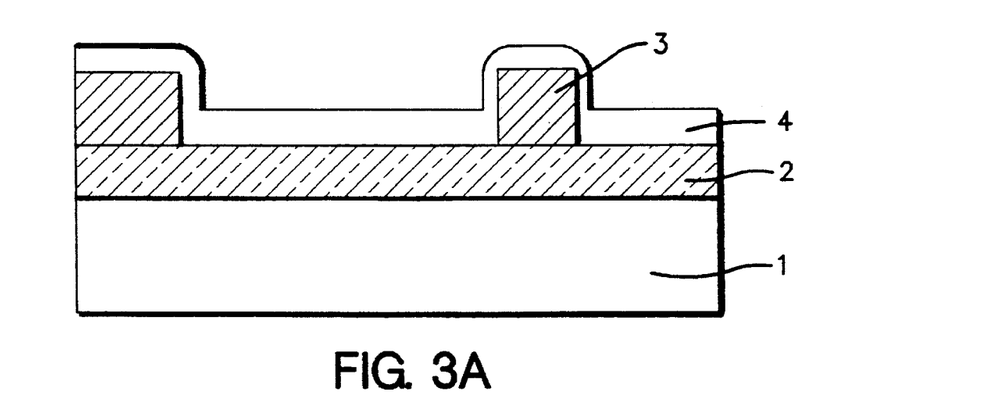
FIGS. 3A and 3D are fragmentary cross sectional elevation views illustrative of sequential steps involved in a novel fabrication method of multilevel interconnections in a semiconductor integrated circuit device of a first embodiment according to the present invention.

With reference to FIG. 3A, a silicon substrate 1 is prepared for a formation of diffusion layers in a surface of the silicon substrate 1. A chemical vapor deposition of silicon oxide is accomplished to thereby deposit a first silicon oxide film 2 having a thickness of approximately 0.5 micrometers on the surface of the silicon substrate 1. A layer made of aluminum having a thickness of approximately 0.7 micrometers is formed on a surface of the first silicon oxide film 2 for a subsequent receipt of such a patterning as to form aluminum wiring lines 3 on the first silicon oxide film 2. After that, an entire surface of the device is subjected to a plasma chemical vapor deposition of silicon oxide to thereby deposit a second silicon oxide film 4 having a thickness of approximately 0.3 micrometers so as to cover not only the surface of the first silicon oxide film 2 but also the aluminum wiring lines 3.

Figure 3B:
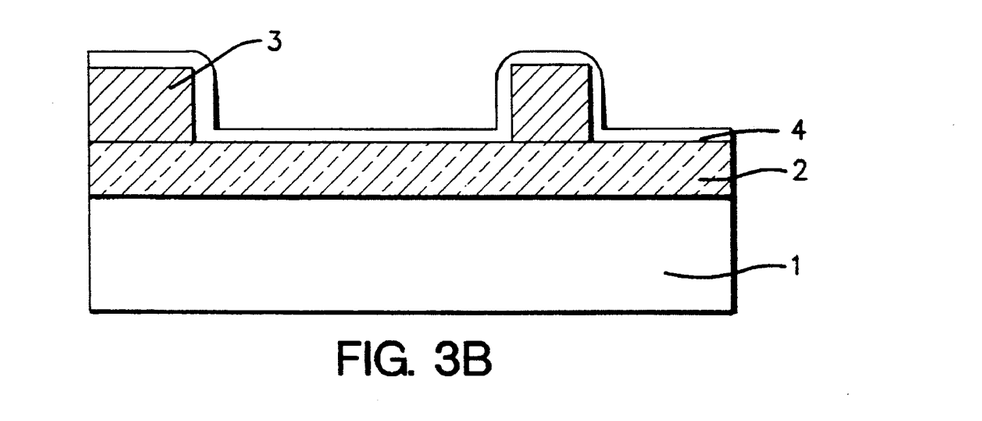

With reference to FIG. 3B, a surface of the deposited second silicon oxide film 4 is exposed to such a dry etching which uses oxygen $O_2$ and a fluorine compound, for example, $CHF_3$ as to etch the surface thereof by approximately 0.1 micrometers. The dry etching is accomplished by using a cathode couple mode dry etching apparatus under the condition that the flow rates of $CHF_3$ and $P_2$ are 25 sccm and 5 sccm respectively at a RF power of 1200 W and a pressure of 0.5 Pa.

Figure 3C:
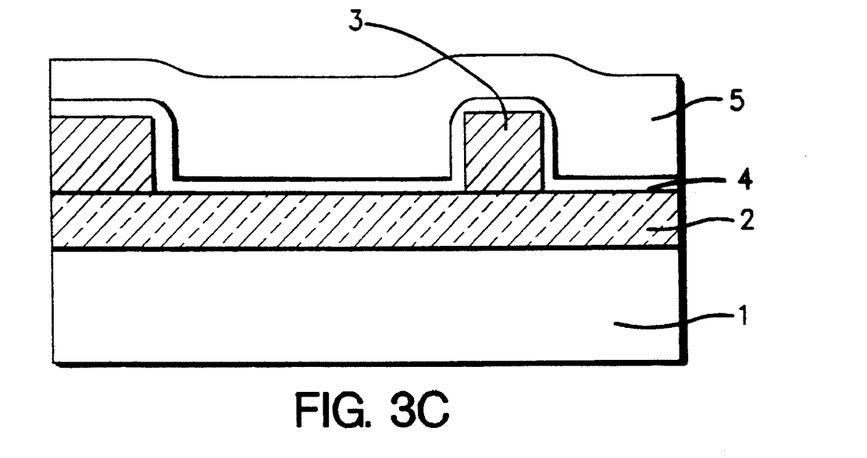

With reference to FIG. 3C, an atmospheric pressure chemical vapor deposition is accomplished under the condition that a flow rate of ozone to tetraethoxysilane (TEOS) is 20:1 so that a third silicon oxide film 5 having a thickness of approximately 1.0 micrometer is deposited on the surface of the second silicon oxide film 4 which has been subjected to the dry etching which uses the fluorine compound $CHF_3$.

Figure 3D:
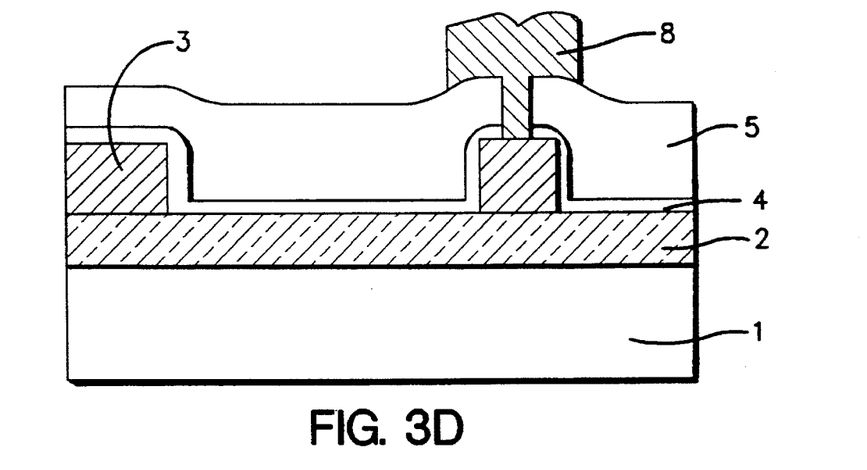

With reference to FIG. 3D, a photo-resist is prepared for patterning and a subsequent alignment thereof on a surface of the deposited third silicon oxide film 5. The second and third silicon oxide films 4 and 5 are subjected to a selective etching which uses the photo-resist pattern as a mask for a formation of a through hole in the second and third silicon oxide films 4 and 5 directly over the aluminum wiring line 3 thereby a part of the aluminum wiring line 3 is exposed through the through hole. After that, a layer made of aluminum is deposited on an entire surface of the device thereby the through hole is filled with the aluminum layer so as to be in contact with the aluminum wiring line 3 underlying the second silicon oxide film 4. The aluminum layer is patterned by such an etching as to have the aluminum layer remain within and in the vicinity of the through hole for a formation of an aluminum wiring line 8.

Actually, the above processes are repeated several times for a formation of the multilevel interconnections in the semiconductor integrated circuit device, although illustrations of subsequent fabrication steps are omitted.

As described above, the second silicon oxide film 4 was deposited by plasma chemical vapor deposition and was subsequently exposed to the etching treatment. Such a surface treatment for the second silicon oxide film 4 allows the third silicon oxide film 5 serving as the interlayer insulator to have an excellent leveled surface not only over the aluminum wiring line 3 underlying the second silicon oxide film 4 but also over other portions. Actually, a considerable improvement in the leveling of the surface of the third silicon oxide film 5 is obtained. This makes the aluminum wiring lines 8 free from inferior patterning as to have a part of the aluminum layer remain on the third silicon oxide film 5. Thus, the resultant multilevel interconnection is free from shorts which are caused by undesirable remaining parts of the aluminum layer on the third silicon oxide film 5. Namely, the excellent leveled surface of the third silicon oxide film 5 allows a fine patterning for a formation of the aluminum wiring line 8 to be obtained.

Further, such surface treatment for the second silicon oxide film 4 allows the third silicon oxide film 5 to be free from any bubbles or voids. Namely, the resultant third silicon oxide film 5 has no bubbles nor voids. This allows the through holes in the second and third silicon oxide films 4 and 5 to have an excellent leveled side wall which keeps the aluminum wiring line 8 within the through hole from having any disconnection. Namely, the complete wiring line 8 is obtained.

Consequently, such a surface treatment for the second silicon oxide film 4 provides a desirable third silicon oxide film 5 which includes no bubble nor void and which has an excellent leveled surface. This suppresses the appearance of shorts and disconnections in the aluminum wiring line 8. That is why considerable improvements in the yield and reliability of the resultant multilevel interconnections are obtained. The resultant semiconductor integrated circuit device including the multilevel interconnection further exhibit excellent performance characteristics.

Although the above descriptions of the fabrication steps of the multilevel interconnections are directed to a preferable example, such desirable multilevel interconnections are available under the following conditions in the fabrication steps.

With respect to the surface treatment for the second silicon oxide film 4, the above-mentioned cathode couple mode dry etching apparatus is replaceable with an anode couple mode dry etching apparatus to accomplish much more isotropic etching to the second silicon oxide film 4. In this case, the desirable effects mentioned above are obtained.

In the dry etching process, the above-mentioned source gases $CHF_3$ and $O_2$ are replaceable with other fluorine gas comprising at least any one of $CF_4$, $C_2F_6$, $SF_6$, $CCl_2F_2$ and the like. In this case, the desirable effects mentioned above are also obtained.

Further, instead of such dry etching, an ion-implantation of any one of $AsF_3$, $AsF_5$ and $BF_3$ into the surface of the deposited second silicon oxide film 4 may be used as the surface treatment for the second silicon oxide film 4. In this case, the desirable effects mentioned above are also obtained.

Alternatively, in the dry etching process for the second silicon oxide film 4, the gas flow rate of oxygen $O_2$ may be in the range from 0% to 25% of the total gas flow rate. In this case, the desirable effects mentioned above are also obtained.

Alternatively, in the atmospheric pressure chemical vapor deposition process for a formation of the third silicon oxide film, the above source gas of the organic silicon compound comprising tetraethoxysilane $Si(OC_2H_5)4$ (TEOS) is replaceable with other organic silicon compounds which comprise at least any one of $SiH(R_3)$, $SiH(OH)_3$, $Si(R)_4$, $Si(OR)_4$, $(OSi(R)_3)_2$, $(OSi(OR)_3)_2$, $(OSi(R)_2)_3$, $(OSi(OR)_2)_3$, $(OSi(R)_2)_4$, and $(OSi(OR)_2)_4$ where R is alkylradial. In this case, such desirable effects as the above-mentioned effects are also obtained.

In addition, in the atmospheric pressure chemical vapor deposition process for the formation of the third silicon oxide film, it is available that the ratio of the flow rate of ozone to tetraethoxysilane (TEOS) is 8:1 or more. Further, in replacement of the atmospheric pressure chemical vapor deposition, a low pressure chemical vapor deposition and a high pressure chemical vapor deposition are available to form the third silicon oxide film 5.

Both the aluminum wiring lines 3 and 8 are replaceable with other metal wiring lines made of other materials comprising at least any one of aluminum alloys such as aluminum/silicon/copper, titanium alloy such as titanium nitride/titanium/tungsten, metal silicide, gold and polysilicon. In this case, such desirable effects as the above-mentioned effects are also obtained.

It is still further available that the thickness of the second silicon oxide film 4 is in the range from 0.2 micrometers to 0.5 micrometers. In this case, such desirable effects as the above-mentioned effects are also obtained.

Other modifications in the fabrication processes for formation of the multilevel interconnection are possible to match various conditions.

A second embodiment according to the present invention will be described with reference to FIGS. 4A and 4D.

Figure 4A:
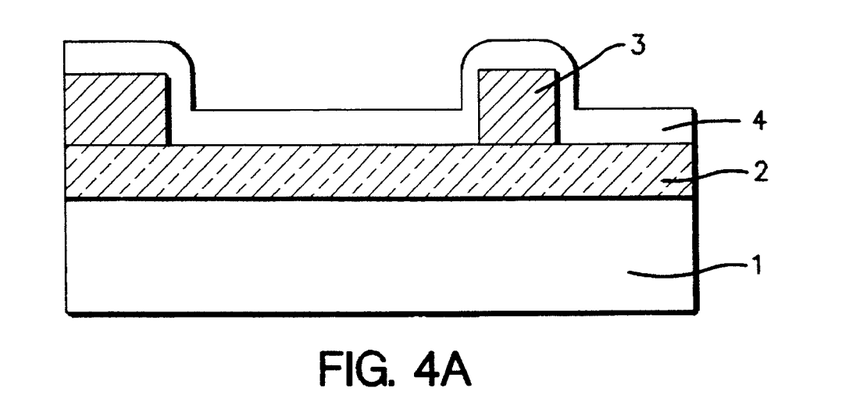
FIGS. 4A and 4D are fragmentary cross sectional elevation views illustrative of sequential steps involved in a novel fabrication method of multilevel interconnections in a semiconductor integrated circuit device of a second embodiment according to the present invention.

With reference to FIG. 4A, a silicon substrate 1 is prepared for a formation of diffusion layers in a surface of the silicon substrate 1. A chemical vapor deposition of silicon oxide is accomplished thereby a first silicon oxide film 2 having a thickness of approximately 0.5 micrometers is formed on the surface of the silicon substrate 1. A layer made of aluminum having a thickness of approximately 0.7 micrometers is formed on a surface of the first silicon oxide film 2 for a subsequent receipt of such a patterning as to form aluminum wiring lines 3 on the first silicon oxide film 2. After that, an entire surface of the device is subjected to a plasma chemical vapor deposition of silicon oxide thereby a second silicon oxide film 4 having a thickness of approximately 0.4 micrometers is so deposited as to cover not only the surface of the first silicon oxide film 2 but also the aluminum wiring lines 3.

Figure 4B:
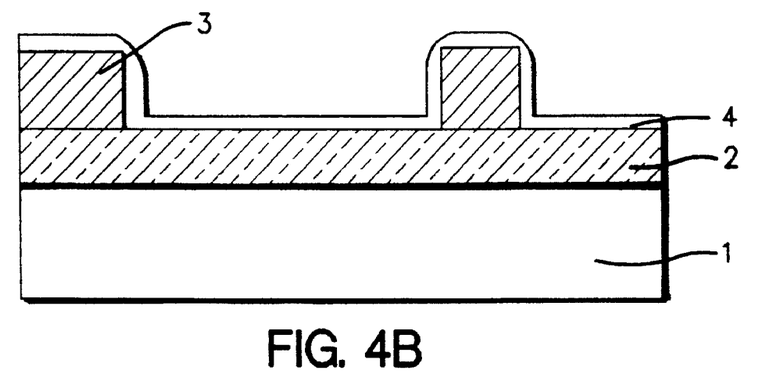

With reference to FIG. 4B, a surface of the deposited second silicon oxide film 4 is exposed to such a dry etching which uses oxygen $O_2$ and a fluorine compound, for example, $CHF_3$ as to etch the surface thereof by approximately 0.1 micrometers. The dry etching is accomplished by using an anode couple mode dry etching apparatus under the condition that the flow rates of $CHF_3$ and $O_2$ are 25 sccm and 5 sccm respectively at a RF power of 1200 W and a pressure of 0.5 Pa.

Figure 4C:
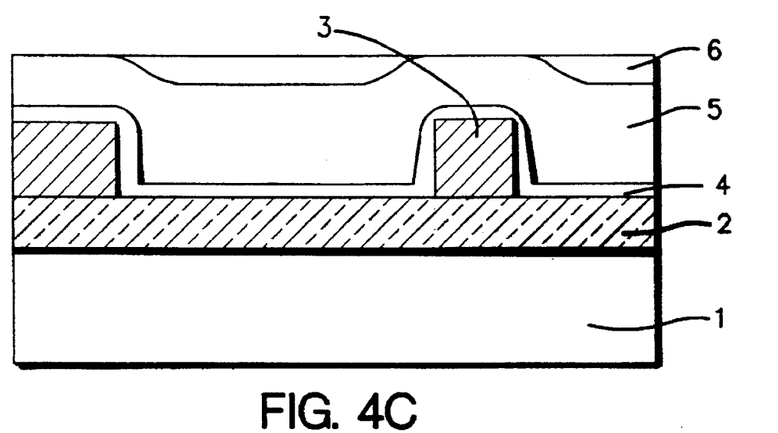

With reference to FIG. 4C, an atmospheric pressure chemical vapor deposition is accomplished under the condition that a flow rate of ozone to tetraethoxysilane (TEOS) is 20:1 so that a third silicon oxide film 5 having a thickness of approximately 1.0 micrometer is deposited on the surface of the second silicon oxide film 4 which as been subjected to such treatment of the dry etching which uses the fluorine compound $CHF_3$. Then, a surface of the deposited third silicon oxide film 5 receives a spin coating of an organic silica solution represented by a formula $CH_3—Si(OH)_3$ at 3000 rpm for a subsequent heat treatment at a temperature of 300° C. for an hour in a nitrogen atmosphere so that an organic silica film 6 such as a spin-on-glass film having a thickness of 0.5 micrometers is formed on the third silicon oxide film 5.

Figure 4D:
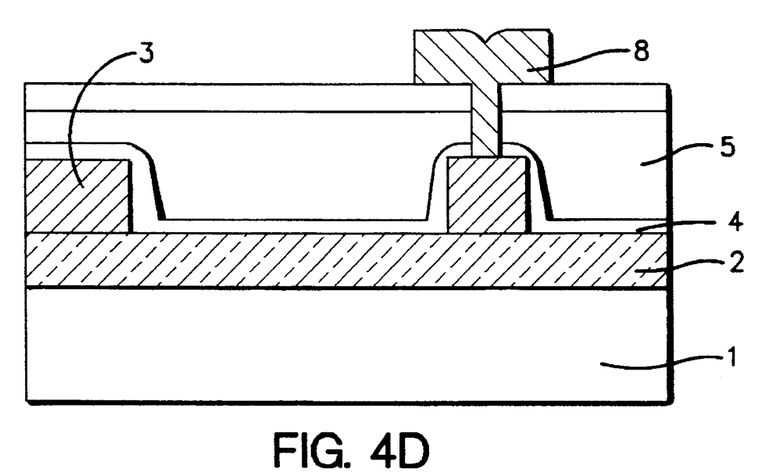

With reference to FIG. 4D, an entire surface of the device and thus a surface of the deposited organic silica film 6 is exposed to an etch back by a dry etching whose selective ratio of the third silicon oxide film 5 to the organic silica film 6 is 1:2 so that the deposited organic silica film 6 is completely removed. Subsequently, the third silicon oxide film 5 is also subjected to the etch back so as to have its thickness become approximately 0.4 micrometers. The surface of the third silicon oxide film 5 subjected to the etch back treatment then receives a plasma chemical vapor deposition of silicon oxide to deposit a fourth silicon oxide film 7 having a thickness of approximately 0.3 micrometers on the etch-backed surface of the third silicon oxide film 5. A photo-resist which has been patterned is prepared for a subsequent alignment on the fourth silicon oxide film 7. The second, third and fourth silicon oxide films 4, 5 and 7 are subjected to a selective etching which uses the photo-resist pattern as a mask for a formation of a through hole in the second, third and fourth silicon oxide films 4, 5 and 7 directly over the aluminum wiring line 3 to thereby expose a part of the aluminum wiring line 3 through the through hole. After that, a layer made of aluminum is deposited on an entire surface of the device to thereby fill the through hole with the aluminum layer so as to be in contact with the aluminum wiring line 3 underlying the second silicon oxide film 4. The aluminum layer is patterned by etching to have the aluminum layer remain within and in the vicinity of the through hole for the formation of an aluminum wiring line 8.

Actually, the above processes are repeated several times for the formation of multilevel interconnections in the semiconductor integrated circuit device, although illustrations of subsequent fabrication steps are omitted.

As described the above, the second silicon oxide film 4 was deposited by the plasma chemical vapor deposition and was subsequently exposed to an etching treatment. Then, the third silicon oxide film 5 and the organic silica film 6 were in turn deposited for a subsequent etch back treatment, followed by the deposition of the fourth silicon oxide film 7. The surface treatment for the second silicon oxide film 4 and the etch back treatment for the silica oxide films 5 and 6 allow the fourth silicon oxide film 7 to have an excellent leveled surface. Actually, a much larger improvement in the leveling of the surface of the fourth silicon oxide film 7 is obtained as compared to that of the first embodiment. This makes the aluminum wiring lines 8 free from inferior patterning as to have a part of the aluminum layer remain on the fourth silicon oxide film 7. Thus, the resultant multilevel interconnection is free from shorts which are caused by the undesirable remaining parts of the aluminum layer on the fourth silicon oxide film 7. Namely, the excellent leveled surface of the fourth silicon oxide film 7 allows a fine patterning for a formation of the aluminum wiring line 8 to be obtained.

Further, similarly to the first embodiment, such surface treatment for the second silicon oxide film 4 allows the third silicon oxide film 5 to be free of any bubble or void. Namely, the resultant third silicon oxide film 5 includes no bubbles or voids. This allows the through hole in the second, third and fourth silicon oxide films 4, 5 and 7 to have an excellent leveled side wall which keeps the aluminum wiring line 8 within the through hole from having any disconnection. Namely, the complete wiring line 8 is obtained.

Consequently, both the surface treatment for the second silicon oxide film 4 and the etch back treatment of the organic silica film 6 and the third silicon oxide film 5 provide the desirable fourth silicon oxide film 5 both which includes no bubbles nor voids and which has an excellent leveled surface. This suppresses shorts and disconnections of the aluminum wiring line 8. That is why considerable improvements in the yield and reliability of the resultant multilevel interconnections is obtained. The resultant semiconductor integrated circuit device including the multilevel interconnections are further able to exhibit an excellent performance.

Alternatively, the thickness of the fourth silicon oxide film 7 may be in the range from 0.2 to 0.5 micrometers.

Alternatively, with respect to the surface process for the second silicon oxide film 4; it is available to accomplish such a dry etching as to have the second silicon oxide film 4 remain only at opposite side walls of the aluminum wiring line 3 thereby a top surface of the aluminum wiring line 3 is exposed. In this case, the desirable effects mentioned above are obtained.

Alternatively, the organic silica film 6, for example, the spin-on-glass film is replaceable with either a photo resist film or a polyimide resin film so as to result in the desirable effects mentioned above.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the sprit and scope of the invention.

What is claimed is:

1. A method for fabricating a multilevel interconnection for a semiconductor integrated circuit device, said method comprising the steps of:

1) forming a first silicon oxide film on a silicon substrate;
   2) forming first metal wiring lines on said first silicon oxide film;
   3) growing a second silicon oxide film on both said metal wiring lines and said first silicon oxide film by chemical vapor deposition;
   4) adhering fluorine ions onto the entire surface of said second silicon oxide film by subjecting said entire surface of said second silicon oxide film to dry etching using a fluorine compound by which said entire surface of said second silicon oxide film is etched by approximately 0.1 micrometers;
   5) growing a third silicon oxide film on said fluorine-adhered second silicon oxide film by chemical vapor deposition using an organic silicon compound;
   6) forming through holes in said second and third silicon oxide films directly over said first metal wiring lines; and
   7) forming second metal wiring lines on said third silicon oxide film directly over said first metal wiring fines, said first and second metal wiring lines being connected through said through holes.

2. The fabrication method as claimed in claim 1, wherein said first silicon oxide film is formed by chemical vapor deposition.

3. The fabrication method as claimed in claim 1, wherein in said third step, said second silicon oxide film is grown by plasma chemical vapor deposition.

4. The fabrication method as claimed in claim 3, wherein in said second step said second silicon oxide film has a thickness in the range from 0.2 micrometers to 0.5 micrometers.

5. The fabrication method as claimed in claim 1, wherein said dry etching is accomplished with use of $CHF_3$ and $O_2$ under the condition of a flow rate ratio of $O_2$ to the total flow rate in the range from 0% to 25%, a RF power of 1200 W and a pressure of 0.5 Pa.

6. The fabrication method as claimed in claim 5, wherein said dry etching uses a cathode couple mode dry etching apparatus.

7. The fabrication method as claimed in claim 5, wherein said dry etching uses an anode couple mode dry etching apparatus.

8. The fabrication method as claimed in claim 1, wherein said fluorine compound is from the group consisting of $CHF_3/O_2$ $CF_4$, $C_2F_6$, $SF_6$ and $CCl_2F_2$.

9. The fabrication method as claimed in claim 1, wherein said chemical vapor deposition in said fifth step is atmospheric pressure chemical vapor deposition using ozone and tetraethoxysilane (TEOS) under the condition that a flow rate ratio of ozone to tetraethoxysilane (TEOS) is 8:1 or more.

10. The fabrication method as claimed in claim 9, wherein said flow rate ratio of ozone to tetraethoxysilane (TEOS) is 20:1.

11. The fabrication method as claimed in claim 1, wherein said organic silicon compound comprises at least any one of $SiH(R)_3$, $SiH(OR)_3$, $Si(R)_4$, $Si(OR)_4$, $(OSi(R)_3)_2$, $(OSi(OR)_3)_2$, $(OSi(R)_2)_3$, $(OSi(OR)_2)_3$, $(OSi(R)_2)_4$ and $(OSi(OR)_2)_4$, where R is alkyl-radical.

12. The fabrication method as claimed in claim 1, wherein said third silicon oxide film has a thickness in the range from 0.5 micrometers to 1.5 micrometers.

13. The fabrication method as claimed in claim 1, wherein said chemical vapor deposition in said fifth step is low pressure chemical vapor deposition.

14. The fabrication method as claimed in claim 1, wherein said chemical vapor deposition in said fifth step is high pressure chemical vapor deposition.

15. The fabrication method as claimed in claim 1, wherein said first and second metal wiring lines is from the group consisting of aluminium, an aluminium alloy, a titanium alloy, a metal silicide, gold and polysilicon.

16. A method of fabricating a multilevel interconnection for a semiconductor integrated circuit device, said method comprising the steps of:

1) forming a first silicon oxide film on a silicon substrate;
   2) forming first metal wiring lines on said first silicon oxide film;
   3) growing a second silicon oxide film on both said metal wiring lines and said first silicon oxide film by chemical vapor deposition;
   4) adhering fluorine ions onto the entire surface said second silicon oxide film by subjecting said entire surface of said second silicon oxide film to dry etching using a fluorine compound by which said entire surface of said second silicon oxide film is etched by approximately 0.1 micrometers;
   5) growing a third silicon oxide film on said fluorine adhered second silicon oxide film by chemical vapor deposition using an organic silicon compound;
   6) forming a dielectric layer on said third silicon oxide film by both spin coating and a subsequent heat treatment;
   7) subjecting said dielectric layer and subsequently said third silicon oxide film to an etch back treatment by dry etching;
   8) growing a fourth silicon oxide film on said third silicon oxide film by plasma chemical vapor deposition;
   9) forming through holes in said second, third and fourth silicon oxide films directly over said first metal wiring lines; and
   10) forming second metal wiring lines on said third silicon oxide film directly over said first metal wiring lines, said first and second metal wiring lines being connected through said through holes.

17. The fabrication method as claimed in claim 16, wherein said dielectric layer comprises a spin-on-glass film.

18. The fabrication method as claimed in claim 17, wherein said spin-on-glass film is formed by both spin coating at a rotation rate of 3000 rpm and a subsequent heat treatment at 300° C. for an hour in a nitrogen atmosphere.

19. The fabrication method as claimed in claim 17, wherein in said seventh step said dry etching for said etch back treatment is accomplished under the condition of a selective ratio of said third silicon oxide film to said spin-on-glass film is 1:2.

20. The fabrication method as claimed in claim 16, wherein said dielectric layer comprises a polyimide resin film.

21. The fabrication method as claimed in claim 16, wherein said dielectric layer comprises a photo-resist film.

22. The fabrication method as claimed in claim 16, wherein said fourth silicon oxide film has a thickness in the range from 0.2 micrometers to 0.5 micrometers.

23. The fabrication method as claimed in claim 16, wherein said first silicon oxide film is formed by a chemical vapor deposition.

24. The fabrication method as claimed in claim 16, wherein in said third step, said second silicon oxide film is grown by plasma chemical vapor deposition.

25. The fabrication method as claimed in claim 24, wherein in said second step said second silicon oxide film has a thickness in the range from 0.2 micrometers to 0.5 micrometers.

26. The fabrication method as claimed in claim 16, wherein in said fourth step said dry etching etches said second silicon oxide film so as to have said second silicon oxide film remain on opposite side walls of said first metal wiring lines.

27. The fabrication method as claimed in claim 16, wherein said dry etching is accomplished with use of $CHF_3$ and $O_2$ under the condition of a flow rate ratio of $O_2$ to the total flow rate in the range from 0% to 25%, a RF power of 1200 W and a pressure of 0.5 Pa.

28. The fabrication method as claimed in claim 27, wherein said dry etching uses a cathode couple mode dry etching apparatus.

29. The fabrication method as claimed in claim 26, wherein said dry etching uses an anode couple mode dry etching apparatus.

30. The fabrication method as claimed in claim 16, wherein said fluorine compound is from the group consisting of $CHF_3/O_2$ $CF_4$, $C_2F_6$, $SF_6$ and $CCl_2F_2$.

31. The fabrication method as claimed in claim 16, wherein said chemical vapor deposition in said fifth step is an atmospheric pressure chemical vapor deposition using ozone and tetraethoxysilane (TEOS) under the condition that a flow rate ratio of ozone to tetraethoxysilane (TEOS) is 8:1 or more.

32. The fabrication method as claimed in claim 31, wherein said flow rate ratio of ozone to tetraethoxysilane (TEOS) is 20:1.

33. The fabrication method as claimed in claim 16, wherein said organic silicon compound is from the group consisting of $SiH(R)_3$, $SiH(OR)_3$, $Si(R)_4$, $Si(OR)_4$, $(OSi(R)_3)_2$, $(OSi(OR)_3)_2$, $(OSi(R)_2)_3$, $(OSi(OR)_2)_3$, $(OSi(R)_2)_4$ and $(OSi(OR)_2)_4$, where R is alkyl-radical.

34. The fabrication method as claimed in claim 33, wherein said third silicon oxide film has a thickness in the range from 0.5 micrometers to 1.5 micrometers.

35. The fabrication method as claimed in claim 16, wherein said chemical vapor deposition in said fifth step is low pressure chemical vapor deposition.

36. The fabrication method as claimed in claim 16, wherein said chemical vapor deposition in said fifth step is high pressure chemical vapor deposition.

37. The fabrication method as claimed in claim 16, wherein said first and second metal wiring lines is from the group consisting of aluminium, an aluminium alloy, a titanium alloy, a metal silicide, gold and polysilicon.

* * * * *